United States Patent
Daws et al.

(10) Patent No.: US 6,669,988 B2
(45) Date of Patent: Dec. 30, 2003

(54) HARDWARE ASSEMBLY FOR CVI/CVD PROCESSES

(75) Inventors: David E. Daws, San Pedro, CA (US); James W. Rudolph, Colorado Springs, CO (US); Dary Zeigler, Sun City, CA (US); Afshin Bazshushtari, Rolling Hills Estates, CA (US)

(73) Assignee: Goodrich Corporation, Brecksville, OH (US)

( * ) Notice: Subject to any disclaimer, the term of this patent is extended or adjusted under 35 U.S.C. 154(b) by 176 days.

(21) Appl. No.: 09/933,465

(22) Filed: Aug. 20, 2001

(65) Prior Publication Data

US 2003/0035893 A1 Feb. 20, 2003

(51) Int. Cl.$^7$ .............................................. C23C 16/26
(52) U.S. Cl. .............................. 427/249.2; 427/255.12; 427/255.7; 427/900
(58) Field of Search .................. 427/249.2, 255.12, 427/255.7, 900

(56) References Cited

U.S. PATENT DOCUMENTS

| | | |
|---|---|---|
| 3,895,084 A | 7/1975 | Bauer |
| 3,991,248 A | 11/1976 | Bauer |
| 4,029,829 A | 6/1977 | Weaver et al. |
| 4,134,360 A | 1/1979 | Fisher et al. |
| 4,212,906 A | 7/1980 | Fisher et al. |
| 4,369,031 A | 1/1983 | Goldman et al. |
| 4,457,967 A | 7/1984 | Chareire et al. |
| 4,580,524 A | 4/1986 | Lackey, Jr. et al. |
| 4,895,108 A | 1/1990 | Caputo et al. |
| 5,190,913 A | 3/1993 | Higashiyama et al. |
| 5,250,323 A | 10/1993 | Miyazaki |
| 5,252,134 A | 10/1993 | Stauffer |

(List continued on next page.)

FOREIGN PATENT DOCUMENTS

| | | |
|---|---|---|
| DE | 39 22 539 A1 | 1/1991 |
| EP | 0 223 642 B1 | 12/1988 |
| EP | 0 592 239 A1 | 4/1992 |
| EP | 0 548 944 A1 | 6/1992 |
| JP | 62-166353 | 1/1986 |
| JP | 63-295476 | 12/1988 |
| JP | 4-108680 | 4/1992 |
| WO | WO 87/04733 | 8/1987 |
| WO | WO 88/10245 | 12/1988 |

OTHER PUBLICATIONS

W.J. Lackey, *Review, Status, and Future of the Chemical Vapor Infiltration Process for Fabrication of Fiber–Reinforced Ceramic Composites*, Ceram, Eng. Sci, Proc., No. 10(7–8), pp. 577–584, 1989.

A.J. Caputo, W.J. Lackey, and D.P. Stinton, *Development of a New, Faster Process for the Fabrication of Ceramic Fiber–Reinforced Ceramic Composites by Chemical Vapor Infiltration*, Oak Ridge National Laboratory, pp. 694–705. (Undated).

(List continued on next page.)

*Primary Examiner*—Timothy Meeks
(74) *Attorney, Agent, or Firm*—Brinks Hofer Gilson & Lione

(57) ABSTRACT

A hardware assembly is provided for controlling a first portion of gas and a second portion of gas in a furnace. The first portion of the gas is introduced to a center opening region of a stack of porous structures. The second portion of the gas is introduced to an outer region of the stack of porous structures. Most of the gas flows out of the hardware assembly from either the center opening region or the outer region while some of the gas flows out through small holes from the other region. A densification method is also provided with two densification processes in which the gas flows in opposite directions in the two densification processes.

23 Claims, 8 Drawing Sheets

U.S. PATENT DOCUMENTS

| | | | |
|---|---|---|---|
| 5,256,162 A | 10/1993 | Drowley et al. | |
| 5,262,356 A | 11/1993 | Fujii | |
| 5,269,847 A | 12/1993 | Anderson et al. | |
| 5,281,295 A | 1/1994 | Maeda et al. | |
| 5,322,568 A | 6/1994 | Ishihara et al. | |
| 5,348,774 A | 9/1994 | Golecki et al. | |
| 5,352,484 A | 10/1994 | Bernard et al. | |
| 5,362,228 A | 11/1994 | Vaudel | |
| 5,391,232 A | 2/1995 | Kanai et al. | |
| 5,439,715 A | 8/1995 | Okamura et al. | |
| 5,470,390 A | 11/1995 | Nishikawa et al. | |
| 5,480,678 A | 1/1996 | Rudolph et al. | |
| 5,503,254 A | 4/1996 | Fisher et al. | |
| 5,853,485 A | 12/1998 | Rudolph et al. | |
| 5,900,297 A | * 5/1999 | Rudolph et al. | 428/66.2 |
| 5,904,957 A | * 5/1999 | Christin et al. | 427/248.1 |

OTHER PUBLICATIONS

A.J. Caputo and W.J. Lackey, *Fabrication of Fiber–Reinforced Ceramic Composites by Chemical Vapor Infiltration*, Oak Ridge National Laboratory, pp. 1–14, 1984.

Donald R. Messier, *Improved Fiber–Reinforced SiC Composites Fabricated by Chemical Vapor Infiltration*, D.P. Stinton, A.J. Caputo, R.A. Lowden, and T.M. Besmann, The American Ceramic Society, Inc., pp. 982–989, 1986.

O. Vohler, P.L. Reiser and E. Sperk, *Deposition of Pyrolytic Carbon in the Pores of Graphite Bodies*, pp. 397–405, vol. 6, Carbon 1968.

M.L. Lieberman and H.O. Pierson, *Effect of Gas Phase Conditions on Resultant Matriz Pyrocarbons in Carbon/Carbon Composites*, pp. 233–241, vol. 12, Carbon 1974.

T.D. Gulden, J.L. Kaae, and K.P. Norton, *Forced–Flow Thermal–Gradient Chemical Vapor Infiltration (CVI) of Ceramic Matrix Composites*, pp. 546–552, Electrochemical Society 1990.

S. Kimura, N. Takase, S. Kasuya, and E. Yasuda, *Fracture Behaviour of C Fiber/CVD C Composite*, Research Laboratory of Engineering Materials, pp. 617–620, 1980.

Alan S. Brown, *Faster Production Processes Cut CCC Costs*, Aerospace America, pp. 18–19, Nov. 1994.

Grafoil, *Introduction to Grafoil*, Technical Bulletin, Union Carbide Corporation. (Undated).

W.V. Kotlensky, *Deposition of Pyrolytic Carbon in Porous Solids*, Chemistry and Physics of Carbon, pp. 173–262, vol. 9, 1973.

Morton L. Lieberman, Richard M. Curlee, Floyd H. Braaten, and George T. Noles, *CVD/PAN Felt Carbon/Carbon Composites*, Composite Materials, pp. 337–348, vol. 9. Oct. 1975.

W.V. Kotlensky, *A Review of CVD Carbon Infiltration of Porous Substrates*, Super–Temp Company, pp. 257–265.14. (Undated).

* cited by examiner

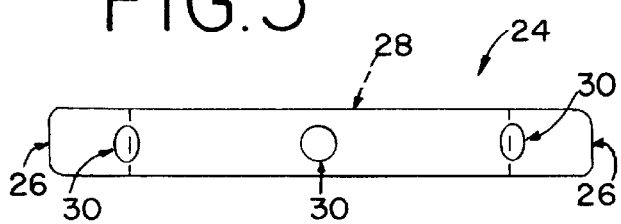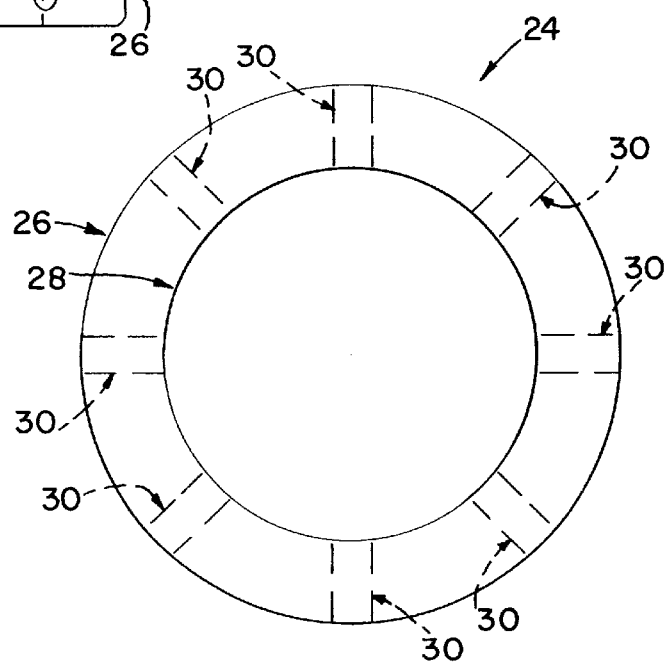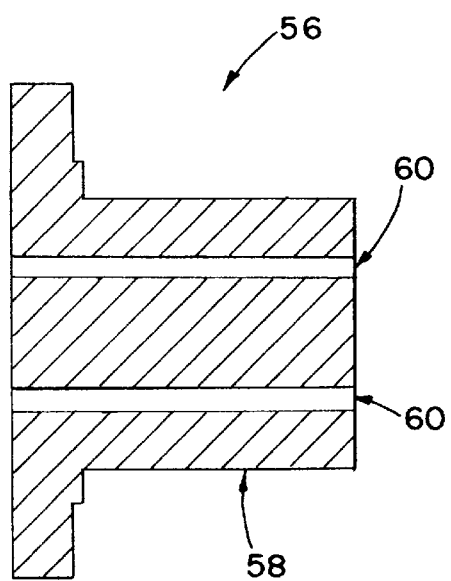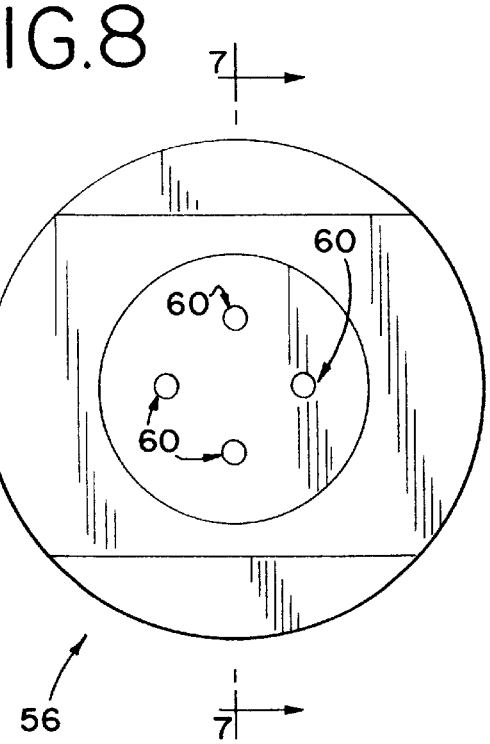

HARDWARE ASSEMBLY FOR CVI/CVD PROCESSES

BACKGROUND

The present invention relates generally to chemical vapor infiltration and deposition ("CVI/CVD") processes, and more particularly, to a hardware assembly for supporting porous structures during a CVI/CVD process.

Chemical vapor infiltration and deposition ("CVI/CVD") is a well known process for depositing a binding matrix within a porous structure. The term "chemical vapor deposition" ("CVD") generally implies deposition of a surface coating, but the term is also used to refer to infiltration and deposition of a matrix within a porous structure. As used herein, the term "CVI/CVD" is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components.

Generally speaking, manufacturing carbon parts using a CVI/CVD process involves placing preformed porous structures in a furnace and introducing a high temperature reactant gas to the porous structures. A variety of porous structures and reactant gases may be used, but typically, a fibrous carbon porous structure is used with a reactant gas mixture of natural gas and/or propane gas when carbon/carbon aircraft brake disks are manufactured. As well understood by those in the art, when the hydrocarbon gas mixture flows around and through the porous structures, some of the carbon atoms separate from the hydrocarbon molecules, thereby depositing the carbon atoms within the interior and onto the surface of the porous structures. As a result, the porous structures become more dense over time as more and more of the carbon atoms are deposited onto the structures. This process is sometimes referred to as densification because the open spaces in the porous structures are eventually filled with a carbon matrix until generally solid carbon parts are formed. U.S. Pat. Nos. 5,480,578 and 5,853,485 to Rudolph et al., hereby incorporated by reference, also describe in detail additional aspects of CVI/CVD processes.

Densification processes for annular brake disks may be characterized as either conventional densification processes or rapid densification processes or variants thereof. In conventional densification, annular brake disks are arranged in stacks with adjacent brake disks stacked on top of each other. A center opening region is thus formed through the center of each stack. Typically, spacers are placed between adjacent brake disks to form open passages between the center opening region and the outer region. Thus, the reactant gas flows randomly around the stack and may flow through the open passages from the center opening region to the outer region or vice versa. As a result, the pressure differential between the inlet and outlet ducts of the furnace is usually relatively low in conventional processes. On the other hand, in rapid densification, the open passages between the center opening region and the outer region are sealed to constrict the flow of the reactant gas between the center opening region and the outer region. Therefore, the pressure differential between the inlet and outlet ducts of the furnace is higher than the pressure used in conventional densification. As a result, the high pressure differential forces the reactant gas to flow through the interior of the porous brake disk structures, thereby increasing the rate of densification compared to conventional processes. Conventional and rapid densification processes may also be combined to achieve optimum densification. For example, a rapid densification process may be used in a first densification to decrease densification time, and a conventional densification may be used in a second densification to improve densification quality.

One area of concern during densification is the distribution of the reactant gas flow through and around the porous structures. Gas flow distribution can have a significant impact on the quality of the densified carbon parts and also can affect the cost of production. For example, in one method disclosed in U.S. Pat. No. 5,904,957 to Christin et al., stacks of annular preforms are placed in a furnace with spacer elements placed between each of the preforms and between the last performs in the stacks and the screens at the top end. Thus, leakage passages are formed between adjacent preforms. The gas is then channeled towards only (i.e., exclusively) the interior passage of each annular stack at the bottom end. The top end of the stacks are closed by solid screens. One disadvantage with this method is that the outer surfaces of the brake disks near the bottom of the stacks may become starved for gas, thereby producing an undesirable densification of the bottom brake disks and nonuniformity between the bottom and top brake disks. Another disadvantage is that the closed top end of the stacks blocks the gas flow out of the top end, thus causing gas stagnation problems as described in detail below.

Another problem that often occurs during densification is soot and tar accumulations on surfaces of the brake disks and/or on the furnace equipment. As is known to those in the art, soot usually refers to undesirable accumulations of carbon particles on the furnace equipment, while tar usually refers to undesirable accumulations of large hydrocarbon molecules on the brake disks and the furnace equipment. Typically, accumulations of soot and tar form when the reactant gas stagnates for a period of time in an area or comes into contact with cooler furnace surfaces. Stagnation typically occurs in areas where the gas flow is blocked or where the gas flow is moving more slowly than the surrounding gas flow. Sudden temperature changes also contribute to the formation of oily substances, such as tar.

Accumulations of soot and tar can cause a number of problems which affect both the quality of the carbon parts and the costs of manufacturing. Seal-coating is one typical problem that can result from soot and tar accumulations, although seal-coating can also be caused by other conditions that are described below. Seal-coating can occur when soot and tar accumulates early in the densification process on surfaces of the porous structure. As the carbon and large hydrocarbon molecules accumulate on the surfaces of the porous structure, the surface pores eventually become blocked, or sealed, thus preventing the flow of reactant gas from further permeating the porous structure. As a result, densification of the interior region around the seal-coated surface prematurely stops, thereby leaving interior porous defects in the finished carbon part.

Maintenance costs also increase due to soot and tar accumulations on the furnace equipment. During the densification process, accumulations of soot and tar often form throughout the furnace equipment. As a result, an extensive manual cleaning process may be periodically required after each production run to remove all the accumulations and prepare the furnace for the next production run. This cleaning job can be very time consuming and can result in significant delays between production runs. The accumulations can also make disassembly of close fitting parts especially difficult since the accumulations tend to bind the parts tightly together. As a result, furnace equipment sometimes becomes damaged during disassembly due to the difficulty of separating the parts. Additionally, the furnace vacuum lines sometimes become constricted by soot and tar. As those in the art are familiar, the vacuum lines are used to generate the desired gas flow through the furnace. However, soot and tar accumulations sometimes build up in these lines and reduce the performance of the vacuum. Therefore, the vacuum lines must be regularly cleaned, which is a time consuming and expensive task.

In order to produce high quality, low cost parts, carbon deposition should be as uniform as possible around and through the porous structures. One way to achieve this desired uniformity is to optimize the residence time of the gas in the furnace. Residence time typically refers to the amount of time required for a gas to travel through the furnace or other designated area. Typically, a low residence time is associated with an unobstructed flow path and is generally preferred.

Gas flow obstructions often cause additional problems during densification. As previously explained, seal-coating is a common problem that causes porous defects within the interior region of the completed carbon parts. However, in addition to the causes previously described, seal-coating also can occur due to nonuniform carbon deposition. This typically occurs when a nonuniform gas flow accelerates carbon deposition at the surface of a part, thereby sealing the surface with carbon deposits and blocking gas diffusion into the interior of the carbon structure. Usually this type of seal-coating occurs later in the densification process when the density of the porous structures are higher.

Another problem associated with nonuniform carbon deposition is the formation of undesirable carbon microstructures. For example, in the case of high performance carbon/carbon brake disks, a rough laminar carbon microstructure is preferred because of the friction and thermal characteristics of this microstructure. However, when the residence time of the gas flow is prolonged or the gas flow stagnates in obstructed areas, smooth laminar and dark laminar carbon microstructures may form instead. As known by those in the art, smooth and dark laminar microstructures are generally undesirable because brake disk performance is reduced unless the outer surfaces containing the undesirable microstructures are machined off in subsequent operations.

BRIEF SUMMARY

Accordingly, a hardware assembly is provided for controlling the flow of gas through and around a stack of annular porous structures in a furnace during CVI/CVD processes. In one embodiment, a distributor is provided which separates the gas into a first portion and a second portion. The first portion of gas passes to a center opening region formed by the stack of annular porous structures. The second portion of gas passes to the outer region around the stack of annular porous structures. Most of the first portion of gas is blocked from completely passing out the top end of the center opening region by a plate and a cap. Some of the first portion of gas, however, is allowed to pass out the top end of the center opening region through holes in the cap and through an open passage between the top annular porous structure and the plate. In another embodiment, the first portion passes to the center opening region and the second portion passes to the outer region without the use of a separate distributor.

In another embodiment, an open space is provided between a floor plate and a bottom base plate. Most of the gas flows from the open space as a second portion to the outer region, while some of the gas flows from the open space as a first portion to the center opening region. Most of the second portion flows through open passages between adjacent porous structures thereby commingling with the first portion. The commingled first and second portions pass out of the center opening region through an exit hole adjacent one end of the stack of porous structures.

A method of densification is also provided with two densification processes. The flow of gas between the center opening region and the outer region is reversed in the two densification processes. In one embodiment, one of the densification processes is a rapid densification process.

BRIEF DESCRIPTION OF SEVERAL VIEWS OF THE DRAWINGS

The invention, including its construction and method of operation, is illustrated more or less diagrammatically in the drawings, in which:

FIG. 5 is a side view of one of the distributors;

FIG. 6 is a top plan view of the distributor;

FIG. 7 is a side cross section view of a cap;

FIG. 8 is a top plan view of the cap;

DETAILED DESCRIPTION

Figure 1:
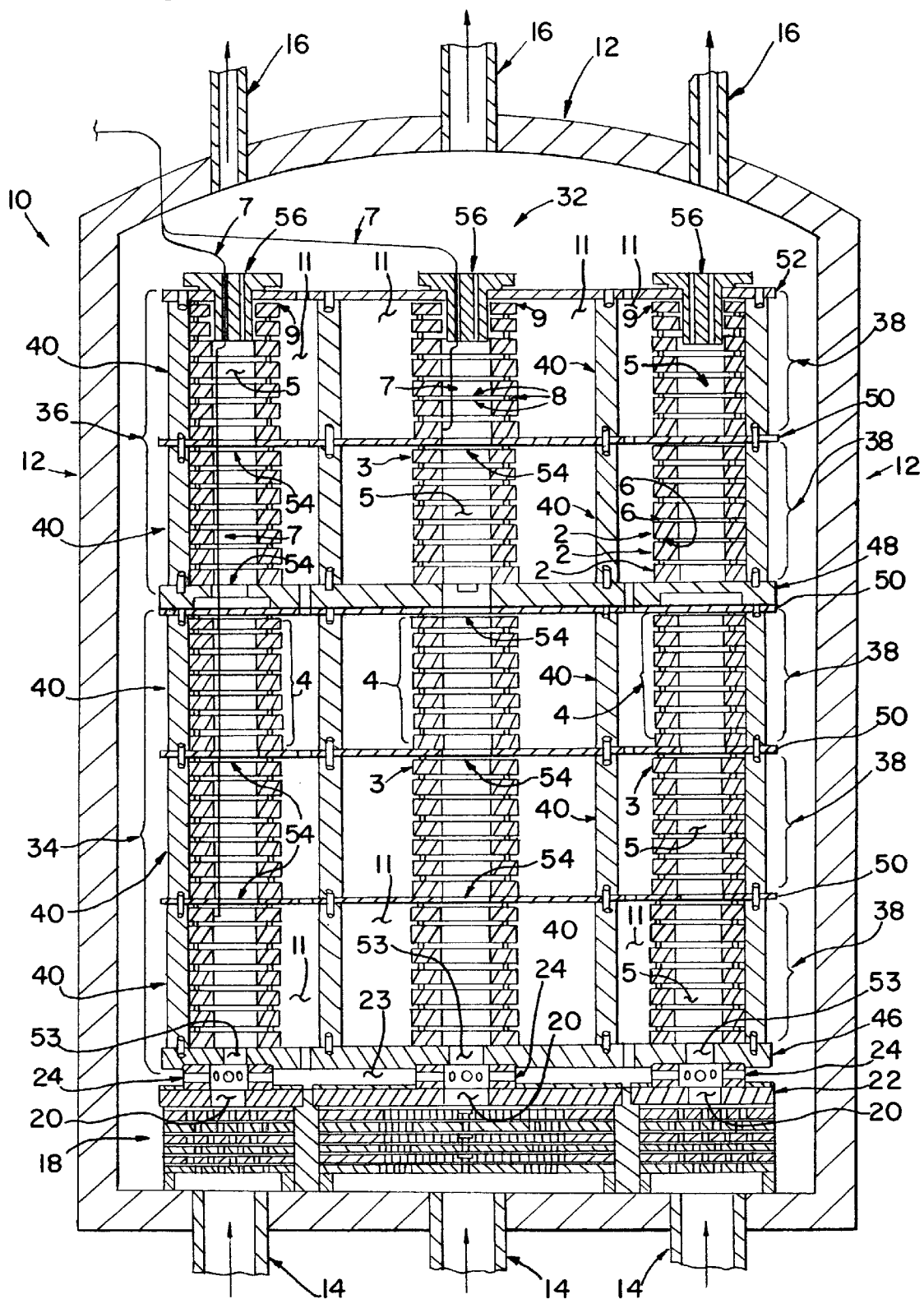
FIG. 1 is a side cross sectional view of a furnace, showing a hardware assembly.

Referring now to the drawings, and particularly to FIGS. 1 through 4, a hardware assembly 32 with gas distributors 24 is provided for chemical vapor infiltration and deposition ("CVI/CVD") processes. The hardware assembly 32 is especially useful for carbon densification of annular porous structures 2 used for high performance brake disks 2 but is likely to be useful in many other applications for composite structures as well. Typically, the hardware assembly 32 supports and positions a number of brake disks 2 which are stacked on top of each other in a number of stacks 4. During the densification process, the hardware assembly 32 and stacks 4 of disks 2 are enclosed in a furnace 10 and hot hydrocarbon gases flow around and through the stacks 4 of brake disks 2, thereby depositing a carbon matrix within the interior regions and on the surface of the porous brake disk structures 2. A variety of processing parameters may be used to densify the porous structures 2, but an absolute gas pressure for the furnace 10 between 1 torr and 20 torr, a temperature range between 1,700° F. and 1,950° F., and a densification time between 150 hours and 500 hours is especially suited for manufacturing aircraft brake disks 2. A variety of gas mixtures may also be used, but a gas mixture of 87% natural gas and 13% propane or a range of 80% to 100% natural gas and 20% to 0% propane is especially suited for manufacturing aircraft brake disks.

A number of different types of furnaces 10 may be used for CVI/CVD processes. Commonly, an induction furnace 10 is used that includes furnace walls 12 that enclose the hardware assembly 32 and the stacks 4 of brake disks 2. The furnace 10 also includes inlet ducts 14 and outlet ducts 16 for introducing and exhausting the gas mixture into and out of the furnace 10. A preheater 18 is also commonly provided within the furnace 10 to heat the gas before the gas is directed to the porous structures 2. Typically, the preheater 18 is sealed and the incoming gas from the inlet ducts 14 is received by the preheater 18 before being introduced to the hardware assembly 32. The preheated gas is then discharged from the preheater 18 through discharge openings 20 in the furnace floor plate 22 of the preheater 18.

At least one distributor 24 is provided at the preheater discharge openings 20 for controlling the flow of gas around the stacks 4 of brake disks 2. Preferably, the distributors 24 are removably mounted between the floor plate 22 of the preheater 18 and the base plate 46 of the bottom hardware assembly modules 34. To aid installation of the distributors 24, recessed areas 19, 45 with guide diameters 21, 47 are provided in both the top surface of the floor plate 22 and the bottom surface of the hardware assembly base plate 46. The recessed areas 19 in the floor plate 22 are generally concentric with each of the discharge openings 20, and the recessed areas 45 in the hardware assembly base plate 46 are generally concentric with each of the inlet openings 53. Therefore, the distributors 24 may be easily installed by inserting the outer diameter 26 of each distributor 24 into one of the guide diameters 21 in the floor plate 22 and one of the guide diameters 47 in the base plate 46.

The distributor 24 (also shown in FIGS. 5 and 6) divides the gas from the preheater 18 into at least two different portions and directs the portions in different directions. Accordingly, the distributor 24 includes an axial hole 28 that extends longitudinally through the distributor 24. Thus, a first portion of gas flows through the axial hole 28 from the preheater discharge opening 20 to the hardware assembly inlet opening 53. The distributor 24 also includes a number of radial holes 30 that extend out from the axial hole 28 to the outer diameter 26 of the distributor 24. Thus, a second portion of gas flows out of the distributor 24 through the radial holes 30 to the space between the floor plate 22 and the bottom base plate 46. Other equivalent passageways, such as grooves or the like, formed into the floor plate 22, the bottom base plate 46, the distributor 24, or other hardware member may also be used in place of the radial holes 30. In one exemplary embodiment, the first portion that flows through the inlet opening 53 of the bottom base plate 46 represents about 76% of the gas mixture, and the second portion that flows out through the radial holes 30 represents about 24% of the gas mixture. In this embodiment, the first gas flow portion is restricted by the inlet opening 53, which is about 5 inches in diameter, in the bottom base plate 46. The second gas flow portion is then restricted by the radial holes 30, which consist of eight holes about 1 inch in diameter. Other proportions for the first portion and second portion may also be advantageous, and other sizes and placement of the inlet opening 53, axial hole 28 and radial holes 30 may be used. For example, the range of flow through the inlet opening may be as low as 20% to as much as 80%, while the range of flow into the space between the floor plate 22 and the bottom base plate 46 may be as high as 80% to as low as 20%. Typically, the preferred embodiment uses a proportion of about 80% for the first portion and about 20% for the second portion, but proportions between 70% and 90% for the first portion and 30% to 10% for the second portion and between 60% to 80% for the first portion and 40% to 20% for the second portion, or vice versa, may be used.

Figure 2:
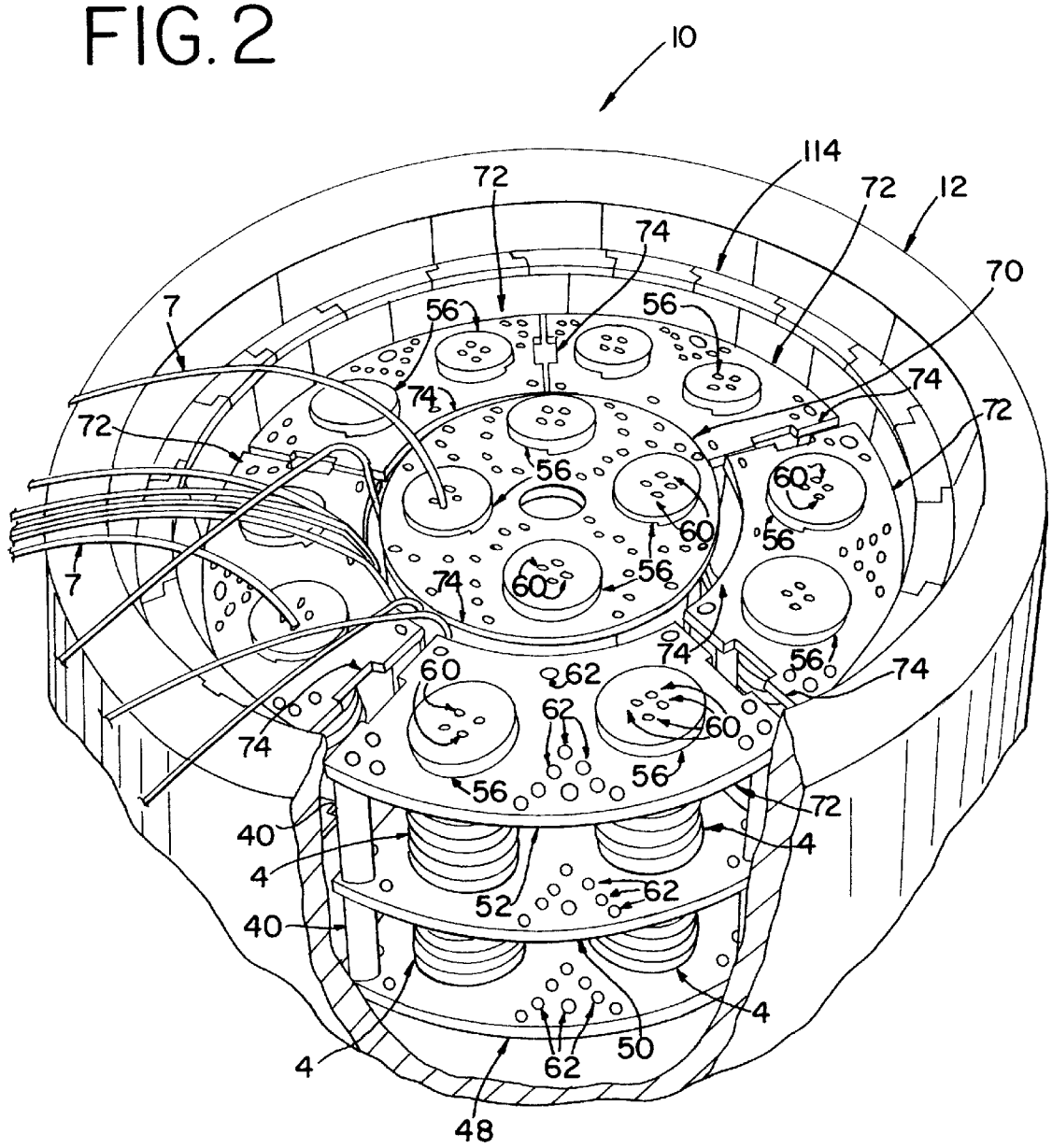
FIG. 2 is a perspective view of the furnace, showing the top of the furnace open and a portion of the furnace wall broken away to show the hardware assembly.
Figure 3:
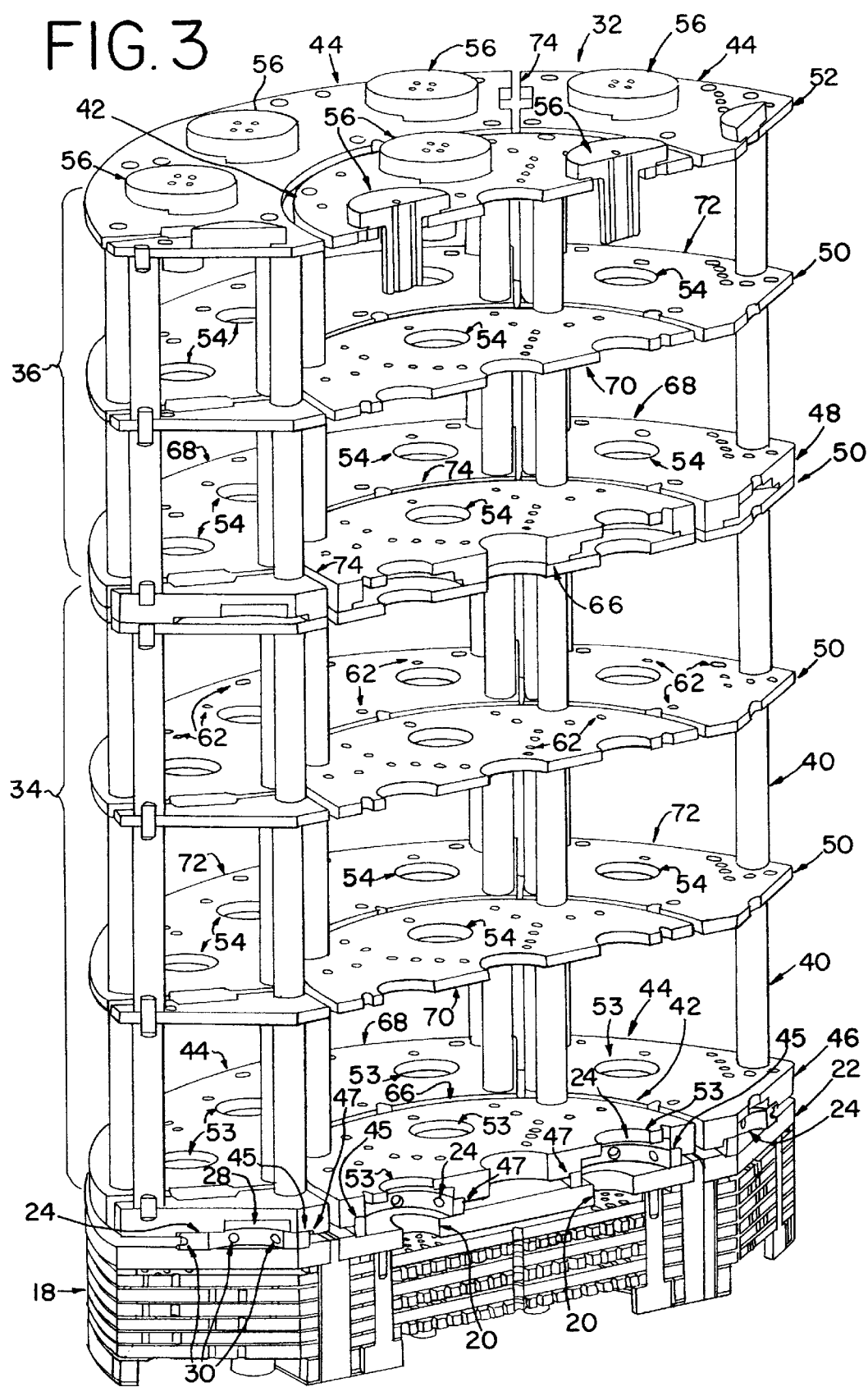
FIG. 3 is a perspective view of a hardware assembly similar to the hardware assembly shown in FIG. 2.
Figure 4:
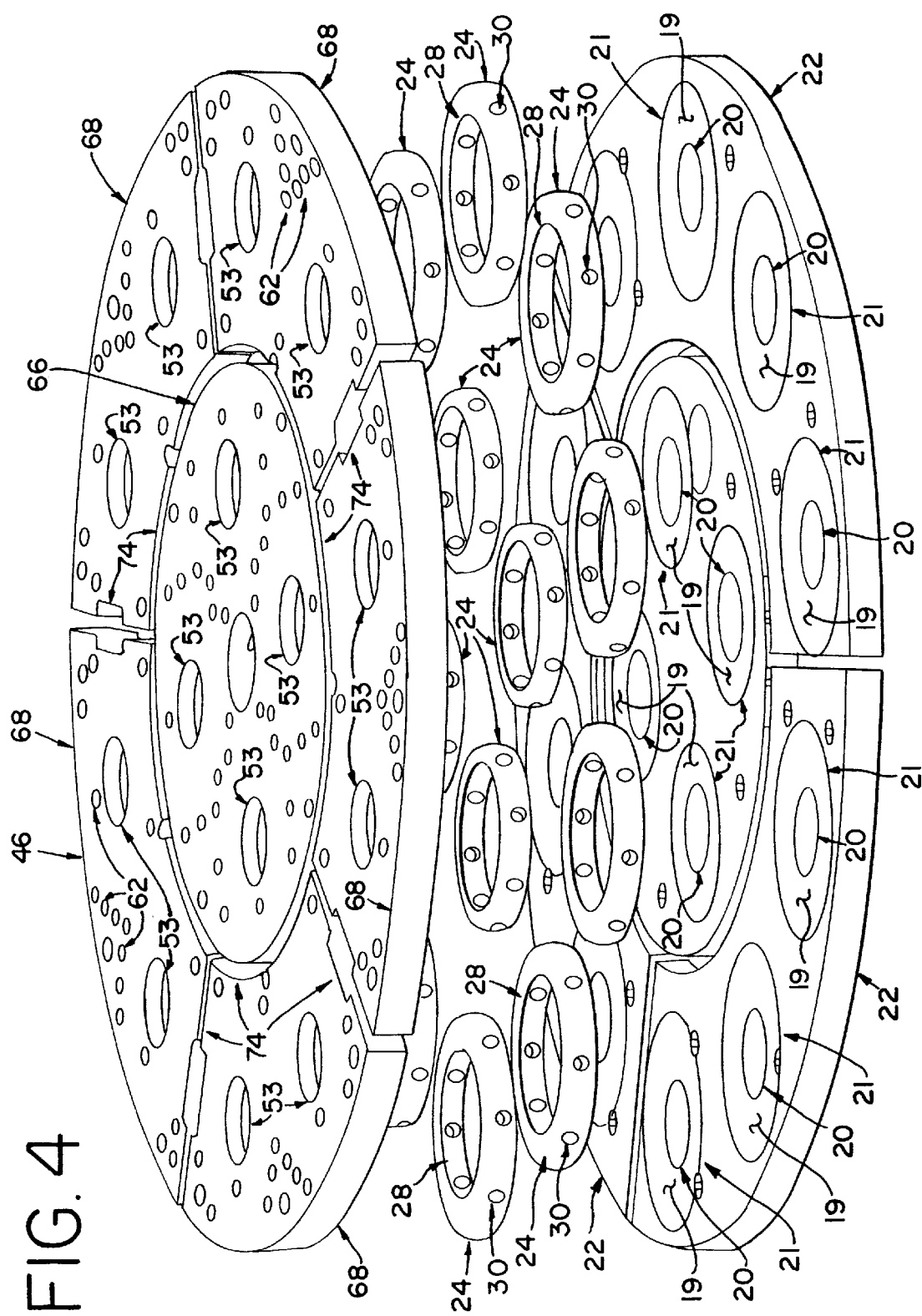
FIG. 4 is an exploded perspective view of a furnace floor plate, a number of distributors and a hardware assembly base plate.

A typical hardware assembly 32 preferably consists of a number of separate modules 34, 36 to make assembly, disassembly, loading and unloading of the hardware assembly 32 easier. Accordingly, as shown in FIG. 1, the hardware assembly 32 includes a bottom set of modules 34 with three units 38. A unit 38 usually refers to the area between an adjacent base plate 46, 48 and a support plate 50 or between adjacent support plates 50, 52 where one level of brake disk stacks 4 is supported. Support posts 40 separate the base plates 46, 48 and support plates 50, 52, thereby forming each unit 38. The hardware assembly 32 also includes a top set of modules 36 similar to the bottom set 34 with two units 38. As shown in FIG. 2, the top and bottom sets of modules 34, 36 also include a center module 42 with typically four stacks 4 of brake disks 2 and a number of arc-shaped outer modules 44 with two or more stacks 4 of brake disks 2 each, although different configurations may be used. Accordingly, each of the modules 34, 36, 42, 44 may be loaded into the furnace 10 one at a time, leaving approximately 1 inch gaps 74 between the outer modules 44 and between the outer modules 44 and the center modules 42. Typically, the base plates 46, 48 and support plates 50, 52 are usually referred to as single base plates 46, 48 and single support plates 50, 52 for simplicity even though the base plates 46, 48 include separate center plates 66 and outer plates 68 and the support plates 50, 52 include similar separate center plates 70 and outer plates 72. Preferably, each of the components of the hardware assembly 32 and the distributor 24 are made from a graphite (e.g., HTM or HLM graphite) material that is compatible with typical CVI/CVD processes used for manufacturing carbon/carbon brake disks 2.

The porous brake disk structures 2 are loaded into the hardware assembly 32 in stacks 4, with each brake disk 2 being separated from adjacent brake disks 2 with spacers 6 about 0.125 to 1.0 inch thick. Therefore, open passages 8 are formed between adjacent brake disks 2. Similarly, the top brake disk 3, 9 in each unit 38 is spaced about 0.125 to 1.0 inch from the bottom surface of the adjacent support plate 50, 52 to form another open passage 8. The stacks 4 of porous brake disk structures 2 are also positioned within the hardware assembly 32 with the center openings 5 of the annular brake disks 2 coaxial with the inlet openings 53 in the bottom base plate 46 and with the transfer openings 54 in the support plates 50 and top base plate 48.

Caps 56 (also shown in FIGS. 7 and 8) are installed into the transfer openings 54 of the top support plate 52 of the top module 36 in order to restrict gas flow through the top of the stacks 4. Each of the caps 56 include an extended portion 58 that extends down into the center openings 5 of the top brake disks 9. Four longitudinal holes 60 are also provided through the caps 56 to allow some gas flow to escape upward from the center openings 5 of the stacks 4. Thermocouple wires 7 may also be routed through the holes 60 in the caps 56 and down through the center openings 5 in the stacks 4. The thermocouple wires 7 are then connected to thermocouples embedded in sample brake disks (not indicated) at various heights in the stacks 4 to measure the representative temperature of the brake disks 2.

It is now apparent that the gas flow through the hardware assembly 32 is more uniform and beneficial compared to other densification processes. Thus, higher quality parts (i.e., with a more uniform and more desirable microstructure)

may be produced with lower manufacturing costs. Accordingly, a gas mixture is supplied to the inlet ducts 14, while a vacuum is produced at the outlet ducts 16. The gas is then drawn through the preheater 18, thereby raising the temperature of the gas. Next, the gas exits the preheater 18 through the discharge openings 20 in the floor plate 22, thereby passing into the axial hole 28 of each of the distributors 24. The gas is then separated into a first portion of about 76% of the gas and a second portion of about 24% of the gas. The first portion passes through the axial hole 28 in the distributor 24 and through the inlet opening 53 in the hardware assembly base plate 46. The second portion passes out through the radial holes 30.

The first portion of gas passes up through the center opening region 5 in the stacks 4 of annular porous structures 2. The gas passes to adjacent stacks 4 in the adjacent units 38 through the transfer openings 54 in the support plates 50 and the top base plate 48. The gas also passes out from the center opening region 5 through the open passages 8 between the adjacent brake disks 2. A controlled pressure is maintained in the center opening region 5 by the caps 56 which block and restrict the gas from completely flowing out from the center opening 5 in the top brake disk 9 of the hardware assembly 32. However, some gas flow is permitted through the center opening 5 of the top brake disk 9 to avoid stagnation of the gas near the top of the stacks 4. Accordingly, some gas flows out through the longitudinal holes 60 in each of the caps 56, and some gas flows out the open passage 8 between the top brake disk 9 and the top support plate 52.

The second portion of gas exits the radial holes 30 in the distributor 24 and passes to the open space 23 between the floor plate 22 and the hardware assembly base plate 46. The gas then passes up into the hardware assembly 32 through passage holes 62 in the center plate 66 and the outer plates 68 of the bottom base plate 46. The gas also passes up through the gaps 74 between the center plate 66 and the outer plates 68 and between each of the outer plates 68. Thus, the gas passes up along the outer region 11 around the outer surfaces of the stacks 4. The gas passes through the units 38 by passing through passage holes 62 and gaps 74 in the support plates 50 and the top base plate 48. As the second portion of gas passes up through the hardware assembly 32, it combines with the first portion of gas from the center opening region 5 as the gas passes out through the open passages 8. When the gas reaches the top of the hardware assembly 32, the gas passes out of the hardware assembly through passage holes 62 and gaps 74 in the top support plate 52. Both portions of gas then exit the furnace 10 through the outlet ducts 16. Thus, it is apparent that the hardware assembly 32 and distributor 24 minimize gas stagnation zones. Therefore, the related problems typically associated with gas stagnation zones are avoided, such as soot and other oily substance accumulations, seal-coating, nonuniform carbon deposition and undesirable microstructures.

Figure 9:
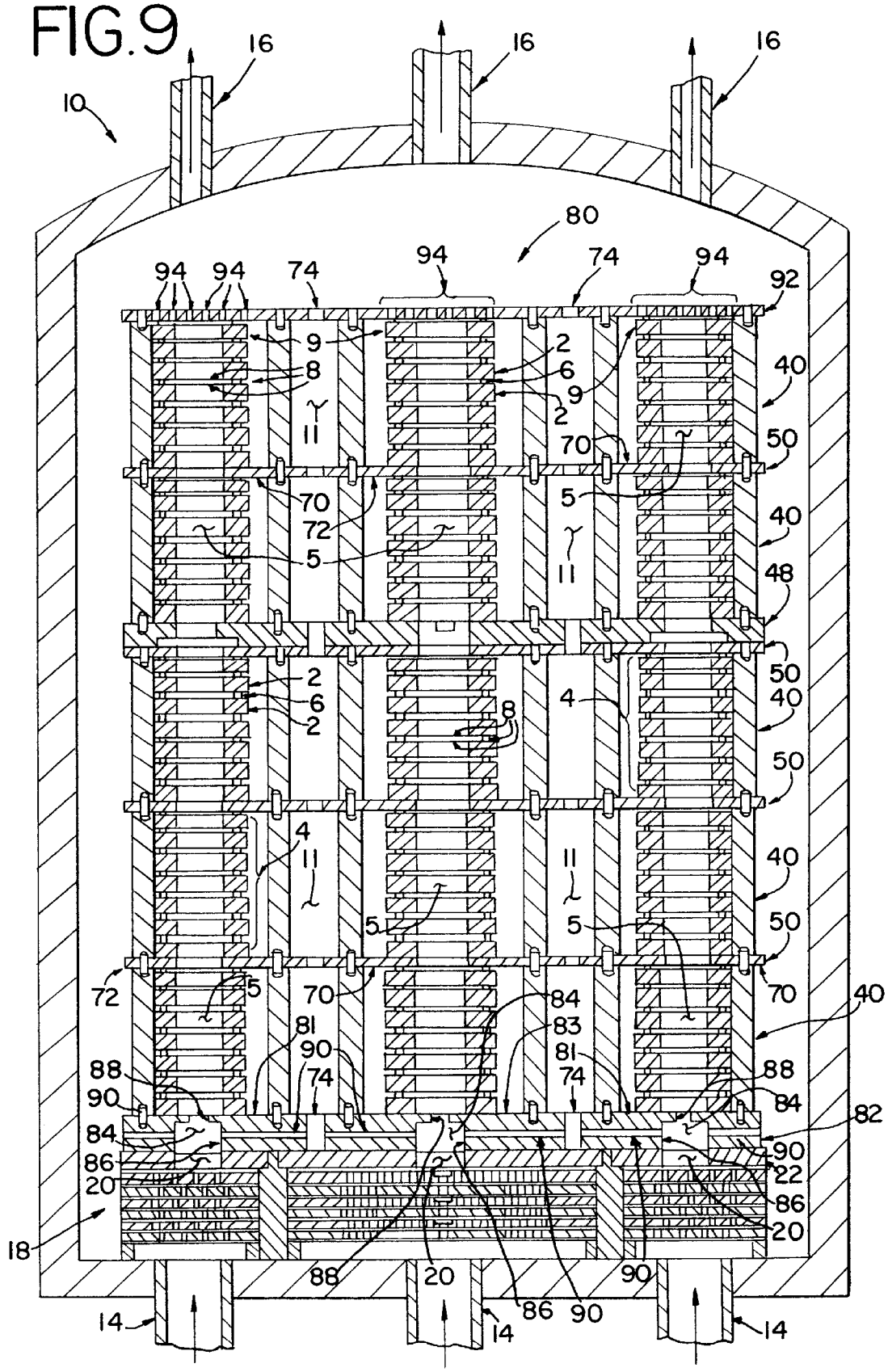
FIG. 9 is a side cross sectional view of a furnace, showing an alternative hardware assembly.

As shown in FIG. 9, the flow of gas through the hardware assembly 80 may also be controlled between a first portion and a second portion without using the distributors 24 and caps 56. In this alternative arrangement, the bottom base plate 82 rests directly on top of the furnace floor plate 22. The inlet openings 84 include a lower, larger diameter hole 86. The radial holes 90 extend through the base plate 82 from the lower, larger diameter holes 86 to the gaps 74 between the outer base plates 81 and between the outer base plates 81 and the center base plate 83 and to the outer edge of the outer base plates 81. Small holes 94 are also provided through the top support plate 92.

The gas flow through the alternative hardware assembly 80 is now apparent. Like the hardware assembly 32 previously described, the hot reactant gas enters through the inlet ducts 14 and passes through the preheater 18. The gas then exits the preheater 18 through the discharge openings 20 and passes directly into the lower, larger diameter hole 86 of the inlet opening 84. Next, a first portion of gas passes through the upper, smaller diameter hole 88 in the inlet opening 84. A second portion of gas also passes through the radial holes 90. Accordingly, as previously described with respect to the first hardware assembly 32, the first portion of gas then passes up through the center opening region 5, while the second portion of gas passes up along the outer region 11. As the first portion of gas passes up through the center opening region 5, most of the first portion passes out to the outer region 11 through the open passages 8 between adjacent brake disks 2 and commingles with the second portion. Some of the first portion, however, passes up through the entire center opening region 5 and exits the hardware assembly 80 through the small holes 94 in the top support plate 92. The remaining commingled gas then exits the hardware assembly 80 through the gaps 74 between the plates 70, 72 and along the outside of the hardware assembly 80.

Figure 10:
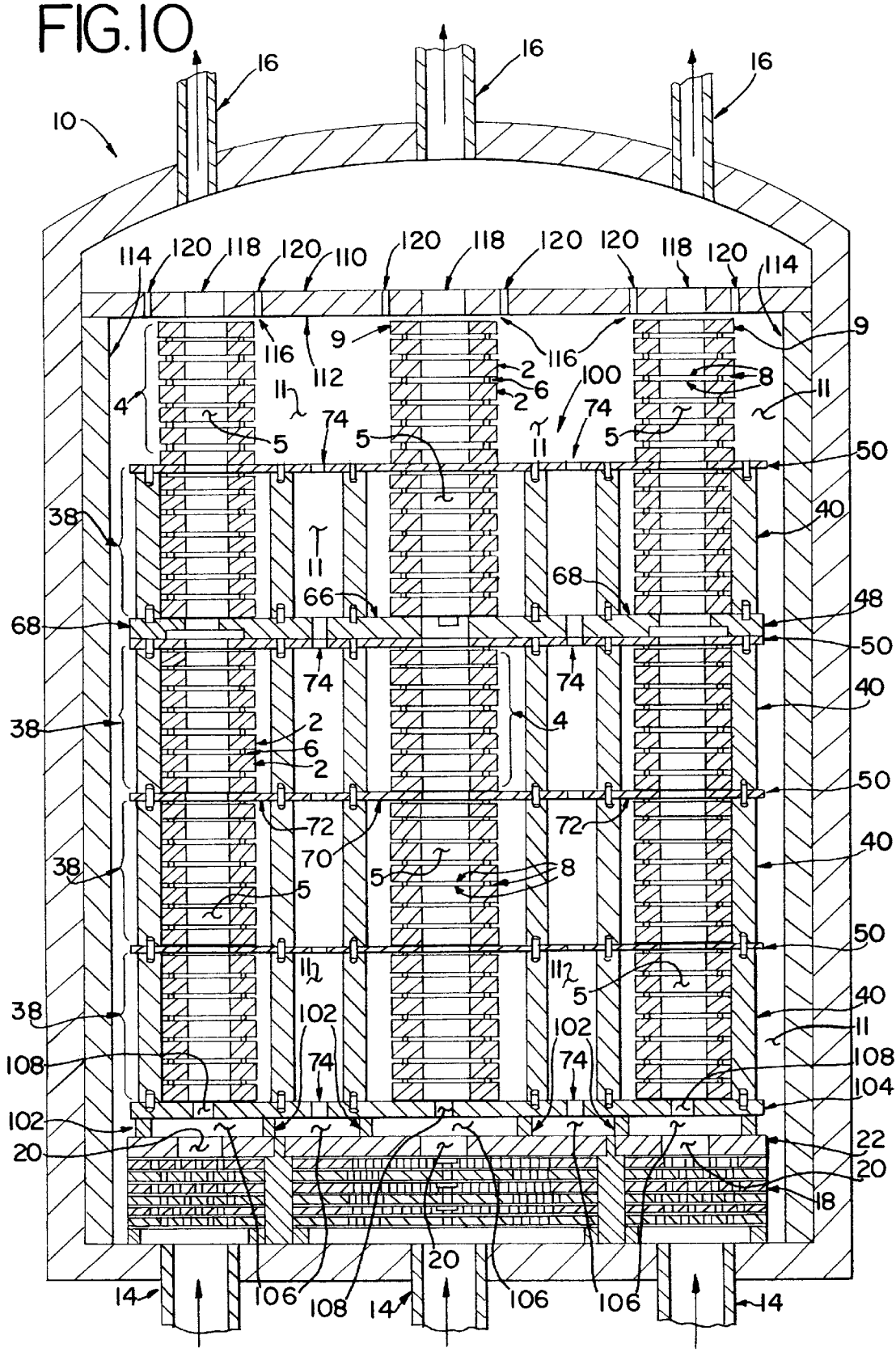
FIG. 10 is a side cross sectional view of a furnace, showing another alternative hardware assembly.

Turning now to FIG. 10, another alternative hardware assembly 100 is shown for flowing most of the gas from the outer region 11 to the center opening region 5. In this hardware assembly 100, spacers 102 are provided between the floor plate 22 and the bottom base plate 104. The spacers 102 may be round or square members and do not restrict gas flow through the space 106 between the floor plate 22 and the bottom base plate 104. The inlet openings 108 in the bottom base plate 104 are also smaller in size than the discharge openings 20 in the floor plate 22 to restrict flow through the inlet openings 108.

If desired, the top unit 38, which is shown in the previous hardware assemblies 32, 80, may be removed in this alternative hardware assembly 100. The top stack 4 of brake disks 2 is then stacked so that the top brake disk 9 is spaced away from the bottom surface 112 of the susceptor lid 110 with an open passage 116 therebetween. Preferably, the open passage 116 is no more than 1 inch wide although larger widths may also be used. Spacer rings, well known to those in the art, may be used to achieve a desired width for the open passage 116. Exit holes 118 are provided through the susceptor lid 110, or comparable plate, directly above each of the stacks 4. Small holes 120 through the susceptor lid 110 may also be provided away from the exit holes 118. The susceptor lid 110 is supported by and sealed to the susceptor walls 114 (the susceptor walls 114 and susceptor lid 110 are not shown in FIGS. 1 and 9 for simplicity).

It is now apparent that in the alternative hardware assembly 100 most of the gas flows from the outer region 11 towards the center opening region 5 instead of from the center opening region 5 towards the outer region 11 as described in the previous hardware assemblies 32, 80. Like the previous hardware assemblies 32, 80, hot reactant gas enters through the inlet ducts 14 and passes through the preheater 18. The gas then exits the preheater 18 through the discharge openings 20 and passes into the space 106 between the floor plate 22 and the bottom base plate 104. Most of the gas flows as a second portion through the space 106 between the floor plate 22 and the bottom base plate 104. The second portion then flows up through the hardware assembly 100 along the outer region 11. The second portion passes through the units 38 by passing through the passage holes 62 (see FIG. 2) and the gaps 74 in the base plates 66, 68 and support plates 70, 72 as previously described. On the other hand, some of the gas flows as a first portion through the inlet openings 108. The first portion then flows up through the center opening region 5. As the first and second portions pass upwards, some of the second portion passes through the open passages 8 between adjacent brake disks 2 towards the center opening region 5, thus commingling with the first portion of gas. The remaining second portion in the outer region 11 passes through the open passage 116 between the top brake disk 9 and the bottom surface 112 of the susceptor lid 110. When the small holes 120 are not provided, the entire first and second portions then pass through the exit holes 118 in the susceptor lid 110 and out through the outlet ducts 16. On the other hand, when the small holes 120 are provided, some of the second portion passes out through the small holes 120, while the rest of the second portion passes through the exit holes 118. A number of proportions for the first and second portions may be used, including 85% for the second portion and 15% for the first portion, a range of 65% to 85% for the second portion and 35% to 15% for the first portion, or other proportions previously described.

Accordingly, one advantage of the hardware assemblies 32, 80, 100 is that successive densification processes may flow reactant gas in opposite directions, that is, from the center opening region 5 to the outer region 11 in one densification process and from the outer region 11 to the center opening region 5 in another densification process. As is well understood by those in the art, densification of porous structures typically involves several successive densification processes. Sometimes, the processing parameters, such as the gas mixture, temperature and pressure, are varied during each of the successive processes in order to optimize the quality of the finished densified product. Machining operations may also be performed on the structures between densification processes.

Figure 11:
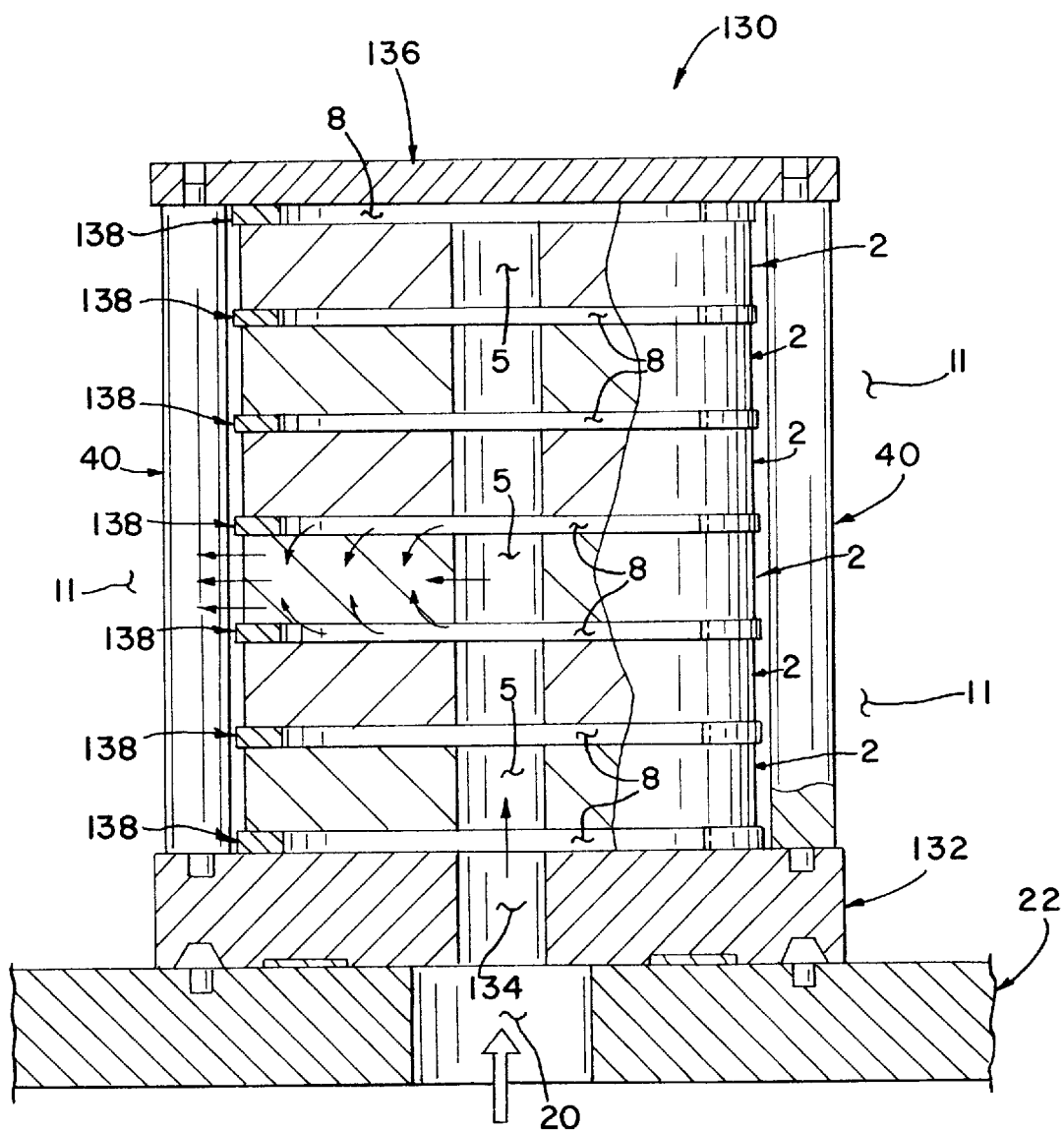
FIG. 11 is a side cross sectional view of a hardware assembly for a rapid densification process.

One way that has been discovered to improve the quality of densification is to reverse the direction of gas flow from prior densification processes. This may be achieved, for example, by using one of the hardware assemblies 32, 80 shown in FIGS. 1 and 9 in a first densification process and then using the hardware assembly 100 shown in FIG. 10 in a second densification process. Thus, in the first process most of the gas flows from the center opening region 5 towards the outer region 11, and in the second process most of the gas flows oppositely from the outer region 11 towards the center opening region 5. The processes may also be reversed to flow the gas from the outer region 11 to the center opening region 5 in the first process and from the center opening region 5 to the outer region 11 in the second process. Additional benefits may be achieved by combining a densification process using one of the hardware assemblies 32, 80, 100 with a rapid densification process, or sometimes referred to as a pressure gradient CVI/CVD process, where the open passages 8 are sealed to restrict gas flow. As shown in FIG. 11, a typical hardware assembly 130 for a rapid densification process includes a base plate 132 with an inlet opening 134. The top of the hardware assembly 130 is sealed with a top plate 136. The open passages are then also sealed with spacer rings 138. Therefore, the reactant gas is forced to flow through the interior region of the brake disks 2 from the center opening region 5 to the outer region 11 or vice versa. Accordingly, a rapid densification process that flows the gas from the center opening region 5 to the outer region 11 may be combined with the hardware assembly 100 shown in FIG. 10 which flows the gas in reverse from the outer region 11 to the center opening region 5. This combination decreases the total time required to completely densify a product while providing a high quality of densification. As previously described, the reactant gas may also be separated into first and second portions that flow separately to the center opening region 5 and the outer region 11 in either one or both of the first and second densification processes. Moreover, substantially all of the reactant gas may flow from the center opening region 5 to outer region 11, or vice versa, in either one or both of the first and second densification processes.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. A method of chemical vapor infiltration and deposition, comprising stacking a number of porous structures in a stack, wherein said stack has a center opening region extending through said porous structures and an outer region extending along said porous structures; introducing a first portion of a reactant gas to said center opening region; and introducing a second portion of said reactant gas to said outer region; wherein said first portion and said second portion are controlled proportions thereby introducing predetermined portions of said reactant gas to both said center opening region and said outer region.

2. The method according to claim 1, wherein said first portion is between about 15% to 80% of said reactant gas and said second portion is between about 85% to 20% of said reactant gas.

3. The method according to claim 1, wherein said first portion is between about 60% to 80% of said reactant gas and said second portion is between about 40% to 20% of said reactant gas.

4. The method according to claim 1, wherein said first portion is between about 15% to 35% of said reactant gas and said second portion is between about 85% to 65% of said reactant gas.

5. The method according to claim 1, further comprising heating said reactant gas to a temperature between about 1,700° F. to 1,950° F., depressurizing said reactant gas to a pressure between about 1 torr and 25 torr, and maintaining said temperature and said pressure between about 150 hours to 500 hours.

6. The method according to claim 1, wherein said reactant gas is a mixture of hydrocarbon gases with between about 80% to 100% natural gas and between about 20% to 0% propane.

7. The method according to claim 1, further comprising spacing said annular porous structures apart thereby forming open passages therebetween and passing at least some of one of said first and second portions of said reactant gas between said center opening region and said outer region through said open passages.

8. The method according to claim 1, further comprising blocking at least a portion of said center opening region at one end of said stack, passing at least some of said first portion of said reactant gas out of said center opening region through a hole at said blocked end, and passing at least some of said second portion of said reactant gas out of said outer region without passing to said center opening region.

9. The method according to claim 1, further comprising spacing one of said annular porous structures at one end of said stack away from a blocking plate thereby forming an open passage therebetween and passing at least some of said first portion of said reactant gas from said center opening region to said outer region through said open passage.

10. The method according to claim 1, further comprising spacing one of said annular porous structures at one end of said stack away from a blocking plate thereby forming an open passage therebetween and passing at least some of said second portion of said reactant gas from said outer region to said center opening region through said open passage.

11. The method according to claim 1, further comprising spacing said annular porous structures apart thereby forming open passages therebetween and passing at least some of said first portion of said reactant gas from said center opening region to said outer region through said open passages; and wherein said first portion is between about 60% to 80% of said reactant gas and said second portion is between about 40% to 20% of said reactant gas.

12. The method according to claim 11, further comprising spacing one of said annular porous structures at one end of said stack away from a blocking plate thereby forming an open passage therebetween and passing at least some of said first portion of said reactant gas from said center opening region to said outer region through said open passage.

13. The method according to claim 12, further comprising blocking at least a portion of said center opening region at one end of said stack, passing at least some of said first portion of said reactant gas out of said center opening region through a hole at said blocked end, and passing at least some of said first portion commingled with said second portion out of said outer region away from said center opening region blocked end.

14. The method according to claim 13, further comprising heating said reactant gas to a temperature between about 1,700° F. to 1,950° F., depressurizing said reactant gas to a pressure between about 1 torr and 25 torr, and maintaining said temperature and said pressure between about 150 hours to 500 hours; and wherein said reactant gas is a mixture of hydrocarbon gases with between about 80% to 100% natural gas and between about 20% to 0% propane.

15. The method according to claim 1, further comprising spacing said annular porous structures apart thereby forming open passages therebetween and passing at least some of said second portion of said reactant gas from said outer region to said center opening region through said open passages; and wherein said first portion is between about 15% to 35% of said reactant gas and said second portion is between about 85% to 65% of said reactant gas.

16. The method according to claim 15, further comprising spacing one of said annular porous structures at one end of said stack away from a blocking plate thereby forming an open passage therebetween, passing a remaining portion of said second portion of said reactant gas from said outer region to said center opening region through said open passage, blocking said outer region at one end of said stack, and passing said first portion and said second portion commingled out of said center opening region through an exit hole in said blocking plate.

17. The method according to claim 15, further comprising spacing one of said annular porous structures at one end of said stack away from a blocking plate thereby forming an open passage therebetween, passing most of a remaining portion of said second portion of said reactant gas from said outer region to said center opening region through said open passage, blocking said outer region at one end of said stack, passing said first portion and most of said second portion commingled out of said center opening region through an exit hole in said blocking plate, and passing at least some of said second portion out of said outer region through holes in said blocking plate away from said exit hole.

18. The method according to claim 1, in combination with a prior densification process, wherein the prior densification process comprises passing a reactant gas between a prior center opening region and a prior outer region, and wherein the method further comprises passing most of one of said first and second portions of said reactant gas between said center opening region and said outer region in an opposite direction to that of the prior densification process.

19. The method according to claim 18, wherein both the prior densification process and the method further comprise spacing said annular porous structures apart thereby forming open passages therebetween whereby said reactant gas passes between said prior center opening region and said prior outer region through said open passages and said reactant gas passes between said center opening region and said outer region through said open passages.

20. The method according to claim 18, wherein the prior densification process further comprises sealing open passages between adjacent annular porous structures thereby constricting flow between said prior center opening region and said prior outer region and thereby forcing said reactant gas to flow through an interior region of said porous structures, and wherein the method further comprises spacing said annular porous structures apart thereby forming open passages therebetween whereby said reactant gas passes between said center opening region and said outer region through said open passages.

21. The method according to claim 20, wherein the prior densification process further comprises forcing most of said reactant gas from said prior center opening region to said prior outer region, and wherein the method further comprises passing most of said reactant gas from said outer region to said center opening region.

22. The method according to claim 21, wherein said first portion is between about 15% to 35% of said reactant gas and said second portion is between about 85% to 65% of said reactant gas.

23. The method according to claim 21, wherein the prior densification process further comprises forcing substantially all of said reactant gas from said prior center opening region to said prior outer region, and wherein the method further comprises passing substantially all of said reactant gas from said outer region to said center opening region.

* * * * *